US012657353B2

(12) United States Patent
Carr

(10) Patent No.: US 12,657,353 B2
(45) Date of Patent: Jun. 16, 2026

(54) PLATFORM FOR ARCHITECTURAL DRAWING GENERATION AND APPROVAL

(71) Applicant: Rendzie, LLC, Miami Beach, FL (US)

(72) Inventor: John William Carr, Miami Beach, FL (US)

(73) Assignee: RENDZIE, LLC, Miami Beach, FL (US)

( * ) Notice: Subject to any disclaimer, the term of this patent is extended or adjusted under 35 U.S.C. 154(b) by 0 days.

(21) Appl. No.: 18/399,496

(22) Filed: Dec. 28, 2023

(65) Prior Publication Data

US 2025/0217528 A1     Jul. 3, 2025

(51) Int. Cl.
*G06F 30/13*          (2020.01)

(52) U.S. Cl.
CPC .................................... *G06F 30/13* (2020.01)

(58) Field of Classification Search
None
See application file for complete search history.

(56) References Cited

U.S. PATENT DOCUMENTS

| | | | |
|---|---|---|---|
| 11,514,642 B2 | 11/2022 | Sinha et al. | |
| 2013/0257864 A1* | 10/2013 | Neuman | H04N 13/363 |
| | | | 345/419 |
| 2020/0057824 A1* | 2/2020 | Yeh | G06F 30/13 |
| 2020/0184711 A1 | 6/2020 | Choi et al. | |
| 2023/0070615 A1 | 3/2023 | Torras et al. | |

FOREIGN PATENT DOCUMENTS

| | | | | |
|---|---|---|---|---|
| KR | 20190054782 A | * | 5/2019 | |
| WO | WO-2021062113 A1 | * | 4/2021 | ............. G06F 30/13 |

OTHER PUBLICATIONS

Jordan et al., Machine learning: Trends, perspectives, and prospects, Jul. 2015, Sciencemag.org, vol. 349 Issue 6245, pp. 255-260 (Year: 2015).*
Yang et al., Apparatus and Method for Enhancing Learning Capacility for Machine Learning (translation), May 2019, Korean Patent Office, pp. 1-11 (Year: 2019).*

* cited by examiner

*Primary Examiner* — Ryan F Pitaro
*Assistant Examiner* — Bernard E Cothran
(74) *Attorney, Agent, or Firm* — GALVIN PATENT LAW LLC; Brian R. Galvin; Brian S. Boon

(57)          ABSTRACT

A platform for architectural drawing generation and approval which allows for easy generation of 3D architectural images from text descriptions, question and answer templates, and/or sample images for user or designer review and approval, and conversion of those 3D architectural images to 2D architectural drawings for permitting and construction. In an embodiment, the system and method involve generating structured requirements via a question and answer structured template, generating 3D images from a combination of the structured requirements and sample images provided by a user, and generating 2D architectural drawings from the 3D architectural images. In an embodiment, the 2D architectural drawings can be submitted for automated code compliance checking via one or more architectural modeling engines.

8 Claims, 15 Drawing Sheets sample image(s)

structured requirements structured requirements

Figure 2:
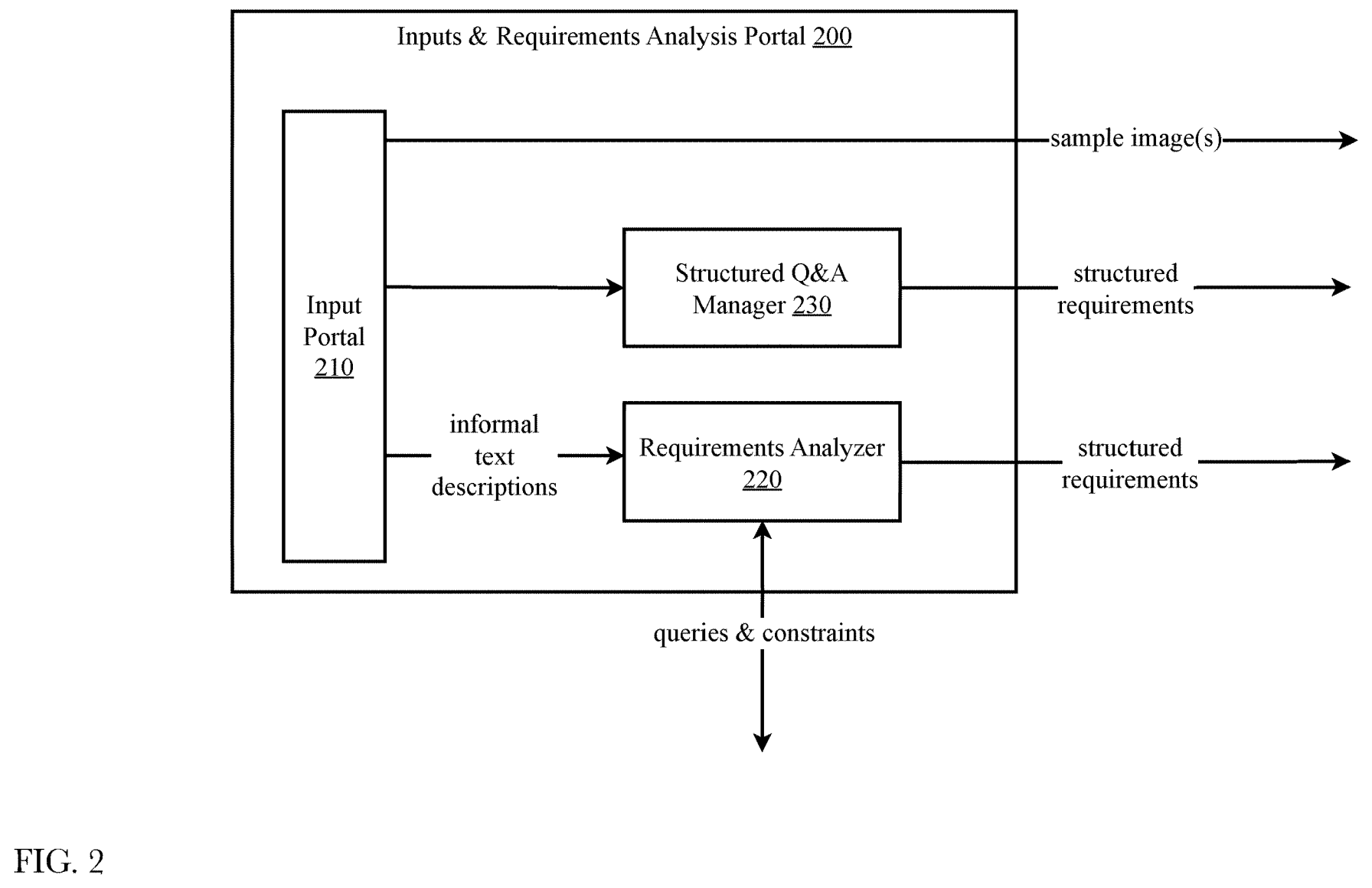

Inputs & Requirements Analysis Portal 200

Structured Q&A Manager 230

Requirements Analyzer 220 queries & constraints informal text descriptions

Input Portal 210

FIG. 2 from 3D image generation manager to construction module

2D Architectural Drawing Generator 500

Image to Floor Plan Labeled Training Database 520

3D to 2D Architectural Drawing MLA 510 to govt. approval system interface

Exemplary Overall Process <u>600</u>

Example of 3D Architectural Image Generation and Verification 900

PLATFORM FOR ARCHITECTURAL DRAWING GENERATION AND APPROVAL

CROSS-REFERENCE TO RELATED APPLICATIONS

Priority is claimed in the application data sheet to the following patents or patent applications, each of which is expressly incorporated herein by reference in its entirety:
None

BACKGROUND OF THE INVENTION

Field of the Art

The present invention is in the field of engineering and construction, and more particularly in the field of computer-aided design of architectural drawings.

Discussion of the State of the Art

Creation of architectural drawings and images is currently a laborious process requiring substantial skill and expertise. Software tools exist which facilitate drawing of two-dimensional (2D) architectural drawings, but these tools take much time and dedication to learn. It is not possible for casual users and inexperienced users (homeowners, for example) to use them with any competence without days or weeks of training or self-learning. Thus, casual users and inexperienced users are unable to generate 2D architectural drawings of their intended designs without hiring a professional to generate them. Professionals must dedicate large amounts of time to architectural drawing generation, and then spend more time applying for permits and interacting with government officials to push the permits through. This leads to substantial construction delay and additional cost before construction can begin.

While some of the software tools mentioned above can create three-dimensional images (3D) of an intended design, they require exacting and detailed 2D architectural drawings as inputs, created using their own proprietary drawing tools. Artificial intelligence (also known as machine learning) based image generators have been created recently which can generate images from informal text descriptions, but as the output of these image generators depends entirely on the training inputs to the machine learning algorithm(s), the user has no control over the accuracy, consistency, or usefulness of the outputs for purposes of generating images of architectural designs.

What is needed is a platform for easy generation of 3D architectural images from text descriptions, question and answer templates, and/or sample images for user or designer review and approval, and conversion of those 3D architectural images to 2D architectural drawings for permitting and construction.

SUMMARY OF THE INVENTION

Accordingly, the inventor has conceived and reduced to practice, a platform for architectural drawing generation and approval which allows for easy generation of 3D architectural images from text descriptions, question and answer templates, and/or sample images for user or designer review and approval, and conversion of those 3D architectural images to 2D architectural drawings for permitting and construction. In an embodiment, the system and method involve generating structured requirements via a question and answer structured template, generating 3D images from a combination of the structured requirements and sample images provided by a user, and generating 2D architectural drawings from the 3D architectural images. In an embodiment, the 2D architectural drawings can be submitted for automated code compliance checking via one or more architectural modeling engines.

According to a preferred embodiment, a system for generating architectural drawings and images from text descriptions is disclosed, comprising: a computing device comprising a memory and a processor; an inputs and requirements analysis portal comprising a first plurality of programming instructions stored in the memory which, when operating on the processor, causes the computing device to: receive an informal text description of an architectural design; convert the informal text description into structured requirements by: parsing the informal text description into its constituent words and phrases; analyze the words and phrases using a natural language processing engine to determine their context; and create a set of structured requirements from the context of the words and phrases, the structured requirements comprising a data structure and data; and send the structured requirements to a three-dimensional (3D) image generation manager and to a two-dimensional (2D) architectural drawing manager; the three-dimensional (3D) image generation manager comprising a second plurality of programming instructions stored in the memory which, when operating on the processor, causes the computing device to: receive the structured requirements; generate a formal text description from the structured requirements using an artificial intelligence (AI) based text generation engine; generate a 3D architectural image by processing the formal text description through an open-source, cloud-based image generation program; verify compliance of the 3D architectural image with the architectural design by receiving input from a human reviewer, wherein: if the input indicates non-compliance, the formal text description is re-generated to correct the non-compliance; and if the input indicates compliance, output the 3D architectural image; the two-dimensional (2D) architectural drawing manager comprising a third plurality of programming instructions stored in the memory which, when operating on the processor, causes the computing device to: receive the structured requirements; generate 2D architectural drawings from the structured requirements by mapping of the data in the data structure to 2D architectural drawing elements; and output the 2D architectural drawing.

According to another preferred embodiment, a method for generating architectural drawings and images from text descriptions is disclosed, comprising the steps of: using an inputs and requirements analysis portal operating on a computing device comprising a memory and a processor to perform the steps of: receiving an informal text description of an architectural design; converting the informal text description into structured requirements by: parsing the informal text description into its constituent words and phrases; analyze the words and phrases using a natural language processing engine to determine their context; and creating a set of structured requirements from the context of the words and phrases, the structured requirements comprising a data structure and data; and sending the structured requirements to a three-dimensional (3D) image generation manager and to a two-dimensional (2D) architectural drawing manager; using the three-dimensional (3D) image generation manager operating on the computing device to perform the steps of: receiving the structured requirements; generating a formal text description from the structured requirements using an artificial intelligence (AI) based text generation engine; generating a 3D architectural image by processing the formal text description through an open-source, cloud-based image generation program; verifying compliance of the 3D architectural image with the architectural design by receiving input from a human reviewer, wherein: if the input indicates non-compliance, the formal text description is re-generated to correct the non-compliance; and if the input indicates compliance, the 3D architectural image is output; using the two-dimensional (2D) architectural drawing manager operating on the computing device to perform the steps of: receiving the structured requirements; generating 2D architectural drawings from the structured requirements by mapping of the data in the data structure to 2D architectural drawing elements; and outputting the 2D architectural drawing.

According to an aspect of an embodiment, an architectural modeling engine is used to: receive a query from the inputs and requirements analysis portal, the query comprising a portion of the data from the structured requirements; determine whether the portion of the data is consistent with a parameter of an architectural model of the architectural modeling engine; and provide a response to the inputs and requirements analysis portal, wherein: if the determination is that the data is consistent with the parameter, the response so indicates; and if the determination is that the data is not consistent with the parameter, the response comprises an architectural constraint.

According to an aspect of an embodiment, the three-dimensional (3D) image generation manager is programmed to perform a second verification of the 3D architectural mage wherein: the 3D architectural image is converted to converted text using an AI-based image-to-text converter; and the converted text is compared to the formal text description using an AI-based text-to-text comparator, wherein: if the comparison falls below a threshold level of likeness, the formal text description is re-generated to increase the level of likeness above the threshold; and if the comparison meets or exceeds the threshold level of likeness, output the 3D architectural image.

According to an aspect of an embodiment, the three-dimensional (3D) image generation manager is programmed to perform a third verification of the 3D architectural mage wherein: the 3D architectural image is analyzed using an AI-based image-to-text converter to determine a subject of the image; and the subject is compared to the formal text description, wherein: if the comparison falls below a threshold level of likeness, the formal text description is re-generated to increase the level of likeness above the threshold; and if the comparison meets or exceeds the threshold level of likeness, output the 3D architectural image.

BRIEF DESCRIPTION OF THE DRAWING FIGURES

FIG. 2 is a block diagram illustrating an exemplary inputs and requirements analysis portal for a system for generating architectural drawings and images from text descriptions.

DETAILED DESCRIPTION OF THE INVENTION

Figure 1:
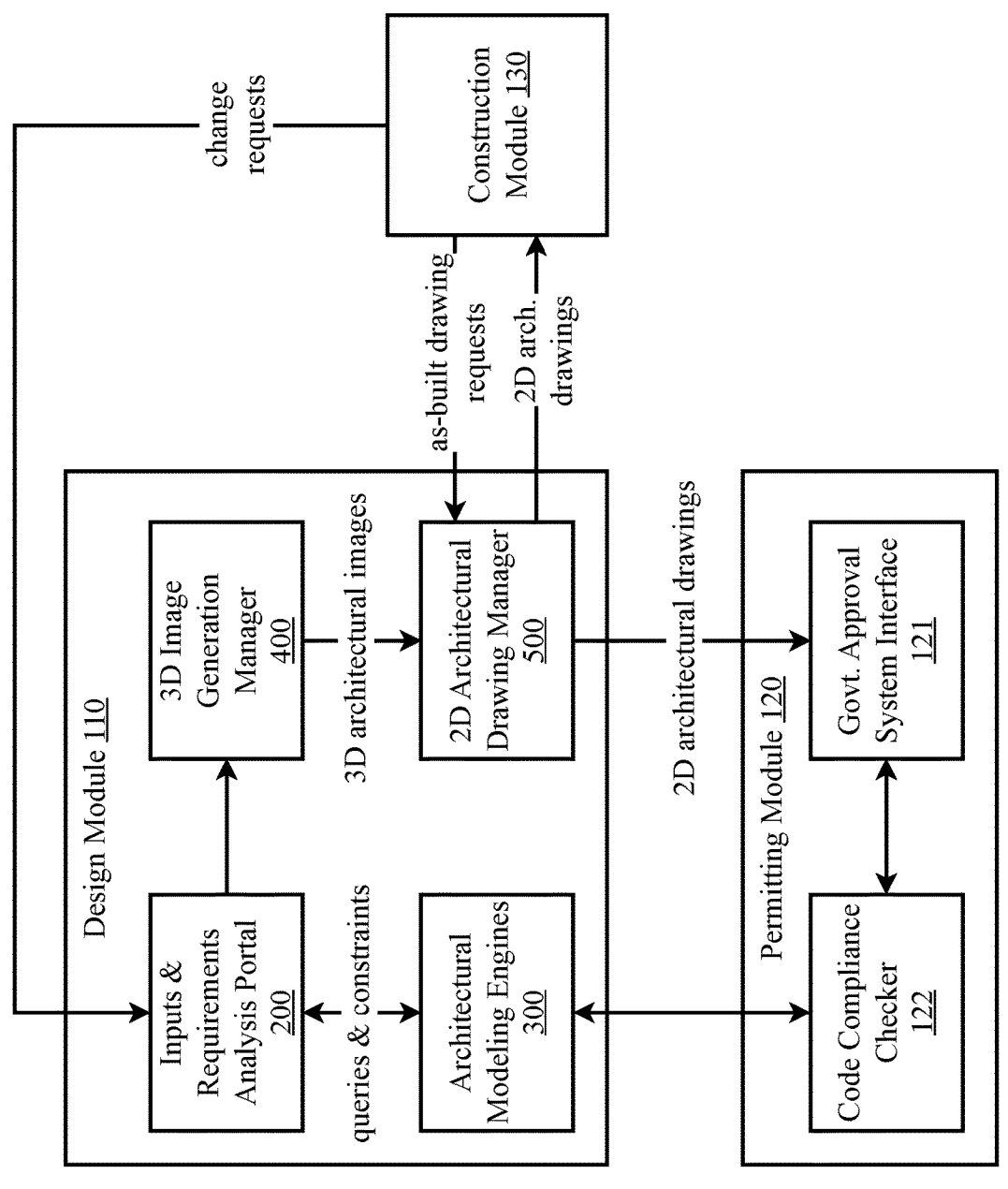
FIG. 1 is a block diagram illustrating an exemplary system architecture for a platform for architectural drawing generation and review.

The inventor has conceived, and reduced to practice, a platform for architectural drawing generation and approval which allows for easy generation of 3D architectural images from text descriptions, question and answer templates, and/or sample images for user or designer review and approval, and conversion of those 3D architectural images to 2D architectural drawings for permitting and construction. In an embodiment, the system and method involve generating structured requirements via a question and answer structured template, generating 3D images from a combination of the structured requirements and sample images provided by a user, and generating 2D architectural drawings from the 3D architectural images. In an embodiment, the 2D architectural drawings can be submitted for automated code compliance checking via one or more architectural modeling engines.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

DETAILED DESCRIPTIONS OF THE DRAWINGS

FIG. 1 is a block diagram illustrating an exemplary system architecture 100 for a system for generating architectural drawings and images from text descriptions. The system of this example comprises a design module 110, a permitting module 120, and a construction module 130.

Design module 110 comprises an inputs and requirements analysis portal 200, one or more architectural modeling engines 300, a 3D image generation manager 400, and a 2D architectural drawing manager 500.

Inputs and requirements analysis portal 200 receives some combination of an informal text description of an architectural design, a set of structured requirements developed via a structured question and answer (Q&A) manager, and sample images showing designs, colors, and textures liked by a user. As an example of informal text input, a user may simply enter: "Design me a kitchen/dining room combination separated by a breakfast counter." Inputs and requirements analysis portal 200 parses the text to create structured requirements, queries one or more architectural modeling engines 300 for compatibility with the models, receives constraints or conflicts from the modeling engines, and prompts the user for missing information or resolution of identified constraints or conflicts. In addition to, or in substitution or, the informal text, a user may enter structured requirements for the design directly into a structured Q&A manager. The user may also provide sample images showing designs, colors, and textures that the user prefers, which may be incorporated at the 3D image generation stage. Once the querying and prompting process is complete, updated structured requirements are sent to 3D image generation manager 400 for generation of architectural images, and to 2D architectural drawing manager 500 for generation of architectural drawings.

Architectural modeling engines 300 are specialized models which determine whether certain characteristics of an intended design will comply with certain sets of rules, standards, measurements, or tolerances. Each architectural modeling engine will have one or more parameters or sets of parameters for determining compliance of elements in a design and/or for selecting appropriate sizes and components for the elements in a design. Each element of the structured requirements of a design is compared to the modeling engine applicable to that element to see whether the element falls within the parameters of the modeling engine. Some modeling engines may have multiple sets of parameters (e.g., an appliance database may have different parameters for each brand of refrigerators). Where an element falls within an applicable set of parameters contained in a modeling engine, the modeling engine may return a confirmation of compliance. Where an element falls outside of an applicable set of parameters contained in a modeling engine, the modeling engine may return a rejection or error. The rejection or error may comprise information such as notification of the rejection or error; the type of rejection or error; constraints such as size mismatches, configuration mismatches, connector mismatches, power requirement mismatches, and potential building code violations; and suggestions for compliance such as size changes, configuration recommendations, suggested adaptors for connection mismatches, and recommendations for bringing the element in compliance with building codes. Some modeling engines may be used for selection of, or recommendation of, components that comply with a given element of a design. For example, if a design specifies a "large refrigerator" a modeling engine may recommend several brands and/or sizes of refrigerator that meet that description. Modeling engines may be used in conjunction with one another. For example, if a design specifies a "large refrigerator" and "standard height wall-mounted cabinets," a fitting engine may retrieve and recommend a standard wall-mounted cabinet height for a given industry (e.g., residential homes) and may pass that standard height to an appliance selection engine for selection of a "large" refrigerator that fits underneath that standard height, excluding models that fall outside of that requirement.

3D image generation manager 400 receives the informal text, structured requirements, and/or sample images from inputs and requirements analysis portal 200, and converts the informal text (if necessary) into a formal text description using an AI-based architectural text generator. 3D image generation manager 400 generates a 3D architectural image of the intended design from some combination of the formal text description, structured requirements, and the sample images using an AI-based image generation engine, verifies the accuracy, consistency, suitability, and/or usefulness of the image for purposes of the design using one or more verification methods, makes appropriate corrections based on the verifications, and outputs a final 3D architectural image for conversion to 2D architectural drawings.

2D architectural drawing manager 500 receives the 3D architectural images and generates 2D architectural drawings for the intended architectural design. The 2D architectural drawings may be used for visualization, measurement, construction bids, permit applications, and/or other purposes for which such drawings are typically used. In an embodiment, the 2D architectural drawings are output to a permitting module 120, and a construction module 130

Permitting module 120 allows for automated or assisted government approval of the 2D architectural drawings, and process which is currently done manually and takes weeks or months to complete. The 2D architectural drawings are received at a government approval system interface 121 which engages a code compliance checker 122 to process the 2D architectural drawings through one or more architectural modeling engines 300 to verify compliance with building code requirements and to check for design errors such an non-fitting components.

Construction module 130 allows contractors to receive electronic copies of the 2D architectural drawings for construction. Where changes occur during construction, the contractor may submit change requests which may be sent to inputs & requirements analysis portal 200 for redo or correction of the design. Logs may be kept of the changes during construction. Upon completion of construction the contractor may request a copy of the as-built drawings, showing the actual construction including changes.

FIG. 2 is a block diagram illustrating an exemplary inputs and requirements analysis portal for a system for generating architectural drawings and images from text descriptions, structured requirements, and/or sample images. Inputs and requirements analysis portal 200 receives some combination of an informal text description of an architectural design, a set of structured requirements developed via a structured question and answer (Q&A) manager, and sample images showing designs, colors, and textures liked by a user via an input portal 210.

Figure 11:
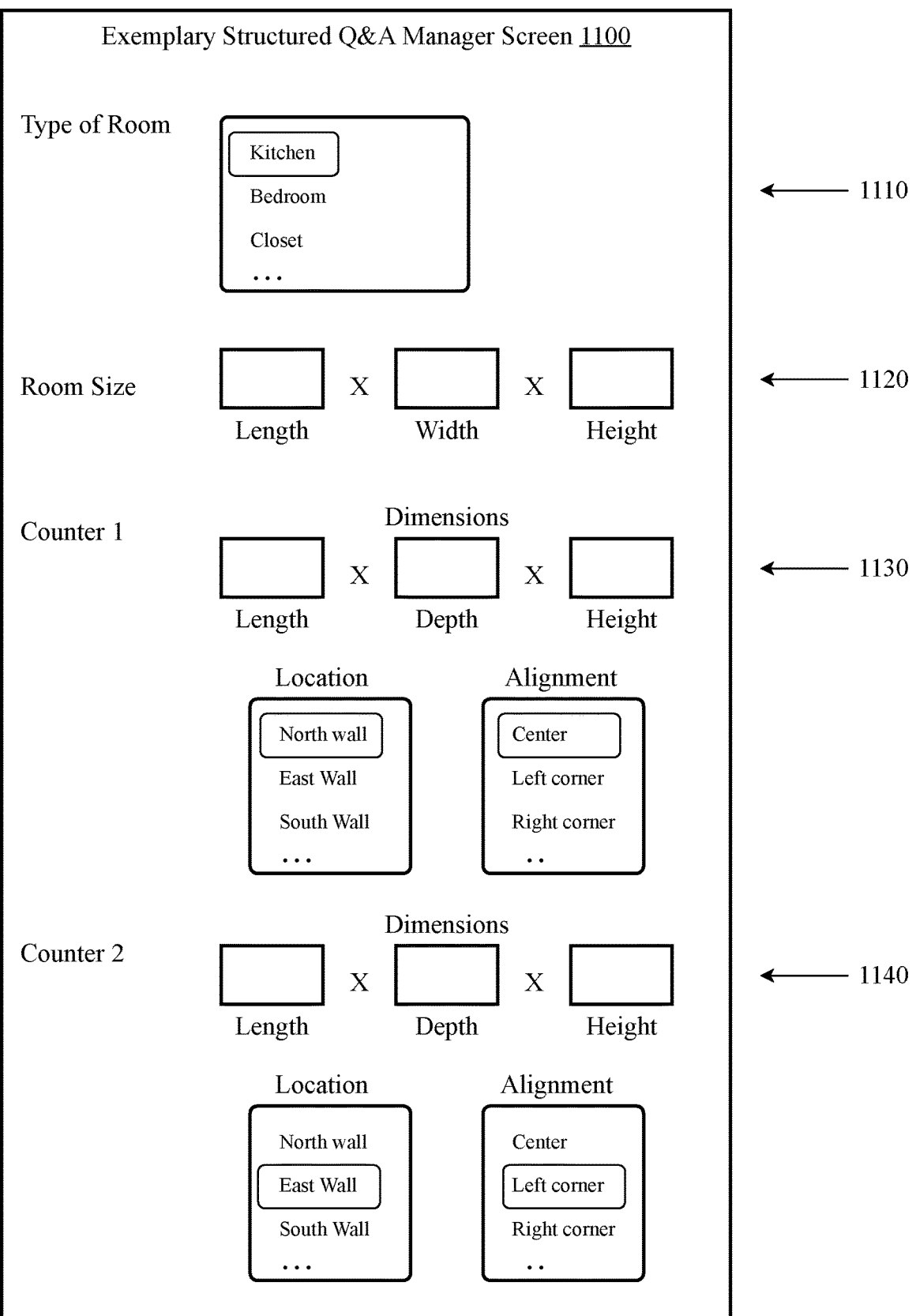
FIG. 11 is an exemplary screenshot for a structured question and answer manager.

Samples images are passed directly to 3D image generation manager.

Where no informal text description is provided, user may enter structured requirements directly into a structured Q&A manager 230. One way to obtain structured requirements for a design project is to query the user using a structured question and answer (Q&A) design template. A structured Q&A design template allows for inputs from a user in a structured format which reduces error and uncertainty and can be directly placed into any needed structured requirements format. An exemplary screenshot for a structured Q&A manager is shown in FIG. 11.

An example of an informal text description might be: "Design me a kitchen/dining room combination separated by a breakfast counter." Input portal 210 passes the information text description to a requirements analyzer 220, which parses the text into its constituent parts of speech and identifies elements of architectural design. Requirements analyzer 220 may use a natural language processing (NLP) engine (not shown) to recognize the words and phrases and place them in context in order to organize them into structured requirements. Requirements analyzer 220 creates an initial set of structured requirements for the design from the identified elements in the parsed text, and uses the structured requirements to query architectural modeling engines 300 for compliance with model parameters for each element of the design and/or for selection of any appropriate components. Requirements analyzer 220 receives selections, constraints, and/or conflicts from the modeling engines, and prompts the user for missing information or resolution of identified constraints or conflicts. Once the querying and prompting process is complete, Requirements analyzer 220 generates updated structured requirements and sends them to 3D image generation manager 400 for generation of architectural images, and to 2D architectural drawing manager 500 for generation of architectural drawings.

Figure 3:
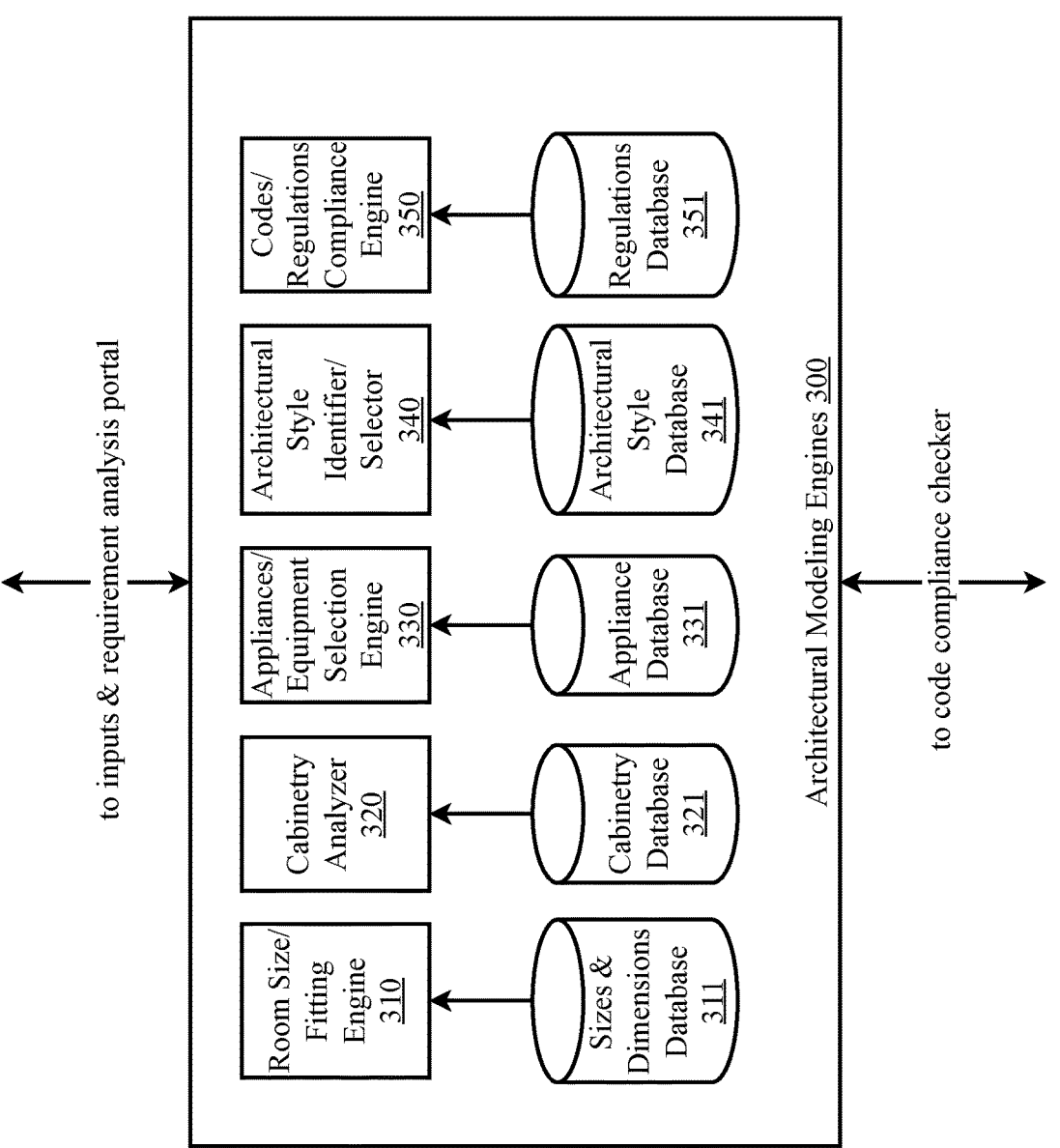
FIG. 3 is a block diagram illustrating exemplary architectural modeling engines for a system for generating architectural drawings and images from text descriptions.

FIG. 3 is a block diagram illustrating exemplary architectural modeling engines for a system for generating architectural drawings and images from text descriptions. A room size/fitting engine 310 may be used to determine whether the room dimensions will fit within the intended overall design, such as determining whether a room height fits within the allocated space between floors of a building, and whether certain elements will fit within available spaces, such as determining whether a particular brand of refrigerator will fit within a space allocated for it, or trying various options for locating cabinetry selected by a cabinetry engine and recommending or placing the cabinetry in the design. Parameters for room size/fitting engine 310 may be stored in a sizes and dimensions database 311, which may comprise industry standard architectural sizes, standards, and/or materials, or architectural sizes, standards, and/or materials for particular clients, projects, circumstances, or applications.

A cabinetry analyzer 320 may be used to select or recommend cabinetry dimensions, countertop heights, cabinet and drawer dimensions, and construction materials. Parameters for cabinetry analyzer 320 may be stored in a cabinetry database 321, which may comprise industry standard architectural sizes, standards, and/or materials, or architectural sizes, standards, and/or materials for particular clients, projects, circumstances, or applications.

An appliances/equipment selection engine 330 may be used to select or recommend appliances and/or equipment appropriate for elements of a design, taking into consideration the specifications of the appliances and/or equipment such as sizes, power requirements, connectors, construction materials, finishes and exterior appearances, and manufacturer recommendations. Parameters for appliances/equipment selection engine 330 may be stored in an appliances/ equipment database 331, which may comprise industry standard architectural sizes, standards, and/or materials, or architectural sizes, standards, and/or materials for particular clients, projects, circumstances, or applications.

An architectural style identifier/selector 340 may be used to identify an architectural design that will be compatible with the intended overall design or to select architectural elements consistent with an identified or specified architectural style, such as form, space, light, materials, textures, colors, and scale; ceiling heights, types, and designs; arches, columns, and other structural elements; engravings, carvings, and other artistic elements; straight lines and curves; and patterns, finishes, visual details, and textural details. Parameters for architectural style identifier/selector 340 may be stored in an architectural style database 341, which may comprise industry standard architectural sizes, standards, and/or materials, or architectural sizes, standards, and/or materials for particular clients, projects, circumstances, or applications.

A building code and regulations compliance engine 350 may be used to determine whether elements of the design comply with applicable building codes and regulations such as setback and sizing requirements, weight bearing requirements, safety requirements, materials requirements, electrical requirements, and sewage and plumbing requirements. Parameters for building code and regulations compliance engine 350 may be stored in a regulations database 351, which may comprise industry standard architectural sizes, standards, and/or materials, or architectural sizes, standards, and/or materials for particular clients, projects, circumstances, or applications.

Figure 4:
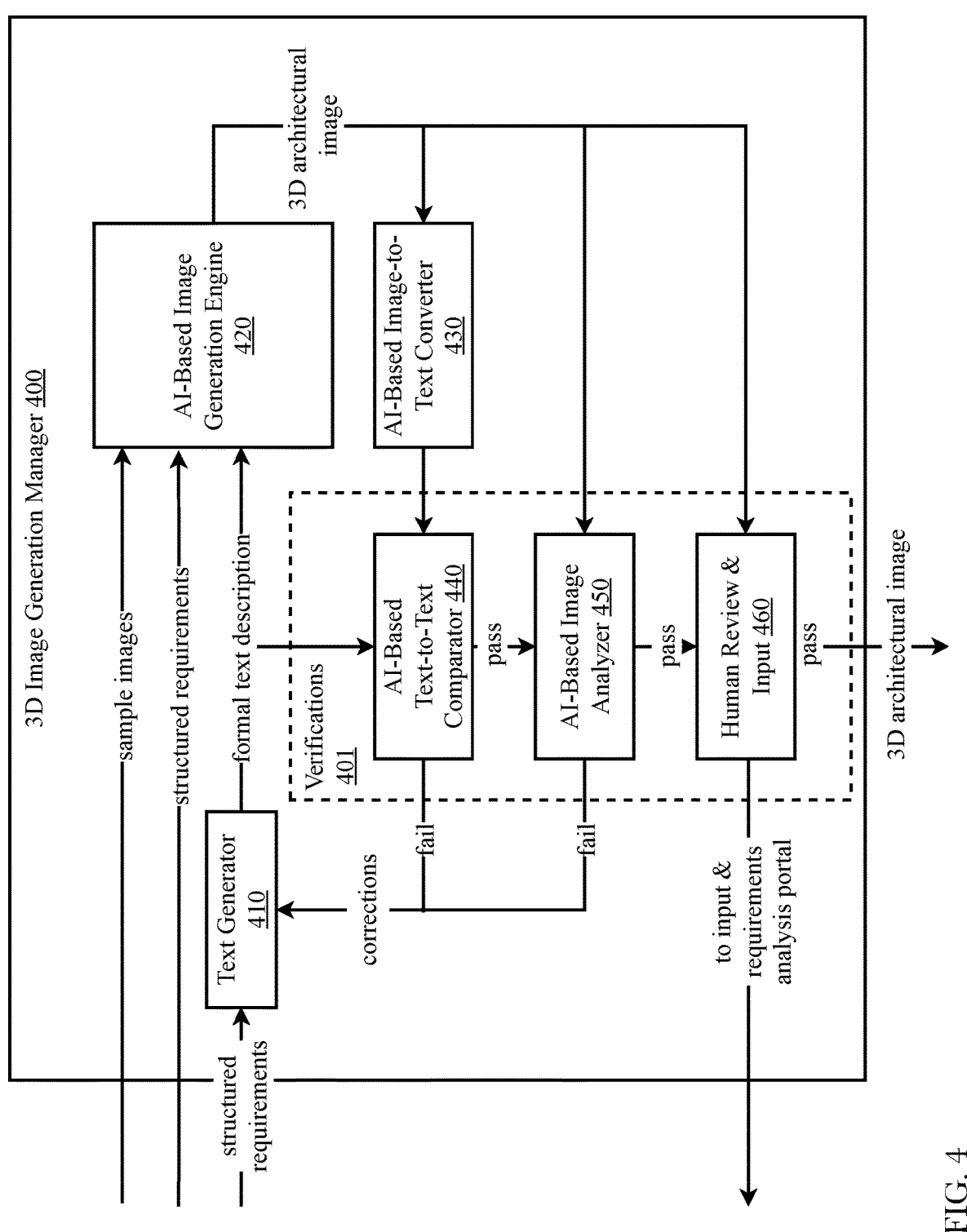
FIG. 4 is a block diagram illustrating an exemplary 3D image generation manager for a system for generating architectural drawings and images from text descriptions.

FIG. 4 is a block diagram illustrating an exemplary 3D image generation manager for a system for generating architectural drawings and images from some combination of text descriptions, structured requirements, and sample images. 3D image generation manager 400 receives sample images and structured requirements from inputs and requirements analysis portal 200. Where AI-based image generation engine 420 has been trained to generate images from text, the structured requirements are first received at an AI-based architectural text generator 410. AI-based architectural text generator 410 comprises a machine learning algorithm configured to convert structural requirements in some form of a data structure (e.g., tables, database formats like SQL databases, JSON files, etc.) into a formal text description which describes the design in terms of its constituent elements and their relationship to one another. In this embodiment, AI-based architectural text generator 410 comprises a purpose-built supervised machine learning algorithm which is trained by processing large amounts of labeled architectural training data through machine learning algorithm so that it develops its own, internal, weighted connections for identifying design elements in the structured requirements and associating architectural words and phrases with those elements. In other embodiments, different types of machine learning algorithms may be used, including those trained using training data that is not specialized to the purpose of recognizing architectural terms. The formal text description is then passed to AI-based image generation engine 420 which generates a 3D architectural image from the formal text description, optionally in conjunction with the structured requirements and/or sample images. In this configuration, AI-based image generation engine 420 comprises an open-source or third-party machine learning algorithm trained to produce images from text by an unknown process. A number of such AI-based image generation engines have been developed in recent years such as DALL*E 2, Midjourney, DreamStudio, and others. None of these image generation engines is trained specifically for generating architectural images, so their outputs will be generic and may not be suitable for architectural design purposes. However, an advantage of the system architecture described herein is that an open-source or third-party image generator may be used in this application because its outputs (which will likely not be tailored to architectural applications) will be modified, amended, and updated through a verification process using one or more verification methods. In other embodiments, AI-based architectural text generator 410 will comprise a purpose-built supervised machine learning algorithm which is trained by processing large amounts of labeled training data through machine learning algorithm so that it develops its own, internal, weighted connections for identifying design elements and associating text with those elements.

Where AI-based image generation engine 420 has been trained to generate images from a combination of structured requirements and sample images, AI-based image generation engine 420 is trained to receive the structured requirements, generate a blank size template (e.g., room dimensions with blank walls) and to apply texturing, special room configurations, or other design elements as shown in the sample images. For example, if the sample images show a kitchen in a Tuscany-style design, coloring and texturing may be applied to the black walls of the template in light earth tones with trowel marks indicating manual application of wall plaster (as opposed to the flat texture of machine-made drywall). AI-based image generation engine 420 may be trained to generate 3D architectural images from a database of labeled training data associating structured requirements with their 3D architectural image counterparts and associating colors, textures, and other design features from sample images with components of 3D architectural images.

Each image generated is then subjected to one or more verification methods 401, a non-limiting list of which includes text-image comparison, image analysis, and human review and input. For the first of these methods, an AI-based image-to-text converter 430 performs the reverse operation of AI-based image generation engine 420, converting the image to a text description. The resulting text description is passed to an AI-based text-to-text comparator 440 to determine the extent to which the text description matches the formal text description used to generate the image. To ensure accuracy of the comparison, AI-based text-to-text comparator 440 of this embodiment comprises a purpose-built supervised machine learning algorithm which is trained by processing large amounts of labeled training data through machine learning algorithm so that it develops its own, internal, weighted connections for identifying design elements and associating text with those elements. A threshold for matching of the text description and formal text description may be established whereby comparison meeting or exceeding the threshold results in a pass of that particular verification. A fail will result in generation of a list of discrepancies between the two text descriptions which will be passed back to AI-based architectural text generator for re-generation of the formal text description to refine it based on discrepancies. In some embodiments, the discrepancies will be passed back further to requirements analyzer 220 to update the structural requirements which will then be re-sent to 3D image generation manager 400.

For the second of these methods, an AI-based image analyzer 450 analyzes the image to determine whether it appears to be an image that reflects the subject of the formal text description. AI-based image analyzer 450 of this embodiment is an open-source or third-party machine learning algorithm trained to identify the subject of an image. A number of such AI-based subject identification engines have been developed in recent years such as Clarifai, Locobuzz, Amazon™ rekognition, Google™ vision AI, various plant recognition engines, and others. None of these image generation engines is trained specifically for generating architectural images, but many will be able to recognize distinct features such as "this is an image of a kitchen," which is sufficient for confirmation that the generated architectural image is in the right category of things. A threshold for matching of the image analysis output and formal text description may be established whereby comparison meeting or exceeding the threshold results in a pass of that particular verification. A fail will result in generation of a list of discrepancies between the image analysis output and the formal text description which will be passed back to AI-based architectural text generator for re-generation of the formal text description to refine it based on discrepancies. In some embodiments, the discrepancies will be passed back further to requirements analyzer 220 to update the structural requirements which will then be re-sent to 3D image generation manager 400.

For the third of these methods, human review and input 460 will be used to assess the degree to which the generated image meets the user's mental concept of the intended design and suitability of the generated image for the user's purposes. In this method, the user determines whether the generated image passes or fails as a representation of the intended design, and the user may provide text feedback comprising discrepancies between the image and the user's mental concept of the intended design. The user's indication of a fail will cause any discrepancies noted by the user to be passed back to input & requirements analysis portal for re-generation or correction of the structured requirements and/or for input of different or additional sample images.

After the generated image passes all verification steps, a final 3D image is output and passed to 2D architectural drawing manager.

Figure 5:
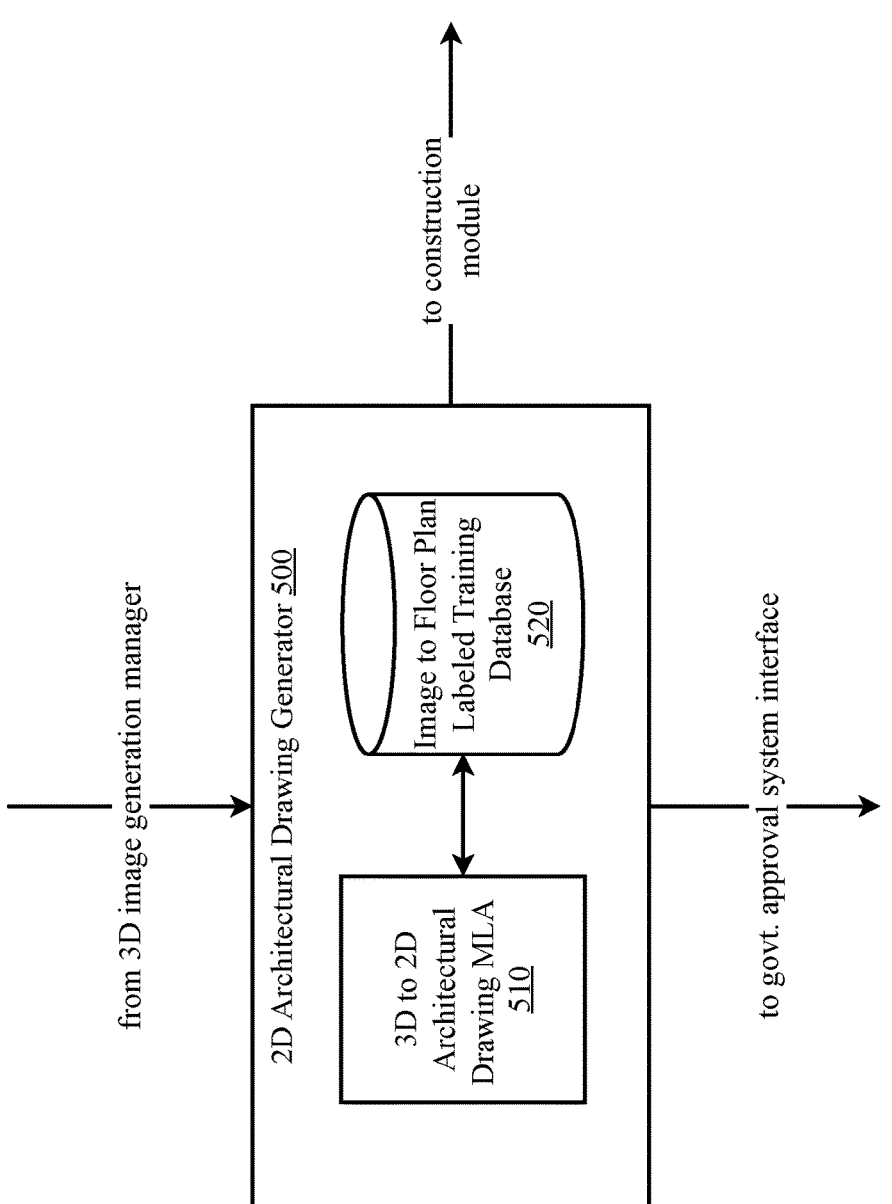
FIG. 5 is a block diagram illustrating an exemplary 2D architectural drawing manager for a system for generating architectural drawings and images from text descriptions.

FIG. 5 is a block diagram illustrating an exemplary 2D architectural drawing manager for a system for generating architectural drawings and images from text descriptions. 2D architectural drawing manager 500 receives the 3D image(s) and generates 2D architectural drawings for the intended architectural design. 2D architectural drawing manager 500 comprises a 3D to 2D architectural drawing machine learning algorithm (MLA) 510 which performs the conversion. 3D to 2D architectural drawing MLA 510 is trained to convert 3D architectural images to 2D architectural drawings using a database of labeled training data associating 3D architectural images with their floor plans 520. In some embodiments, 3D to 2D architectural drawing MLA 510 may further be trained to utilize the structured requirements in making the conversion. In some embodiments, tools other than an MLA may be used to convert the structured requirements directly to 2D architectural drawings as described in the process shown in FIG. 10. Where conflicts or ambiguities exist, they can be clarified by querying architectural modeling engines 300 or by prompting the user for additional information. The 2D architectural drawings may be used for visualization, measurement, construction bids, permit applications, and/or other purposes for which such drawings are typically used.

Figure 6:
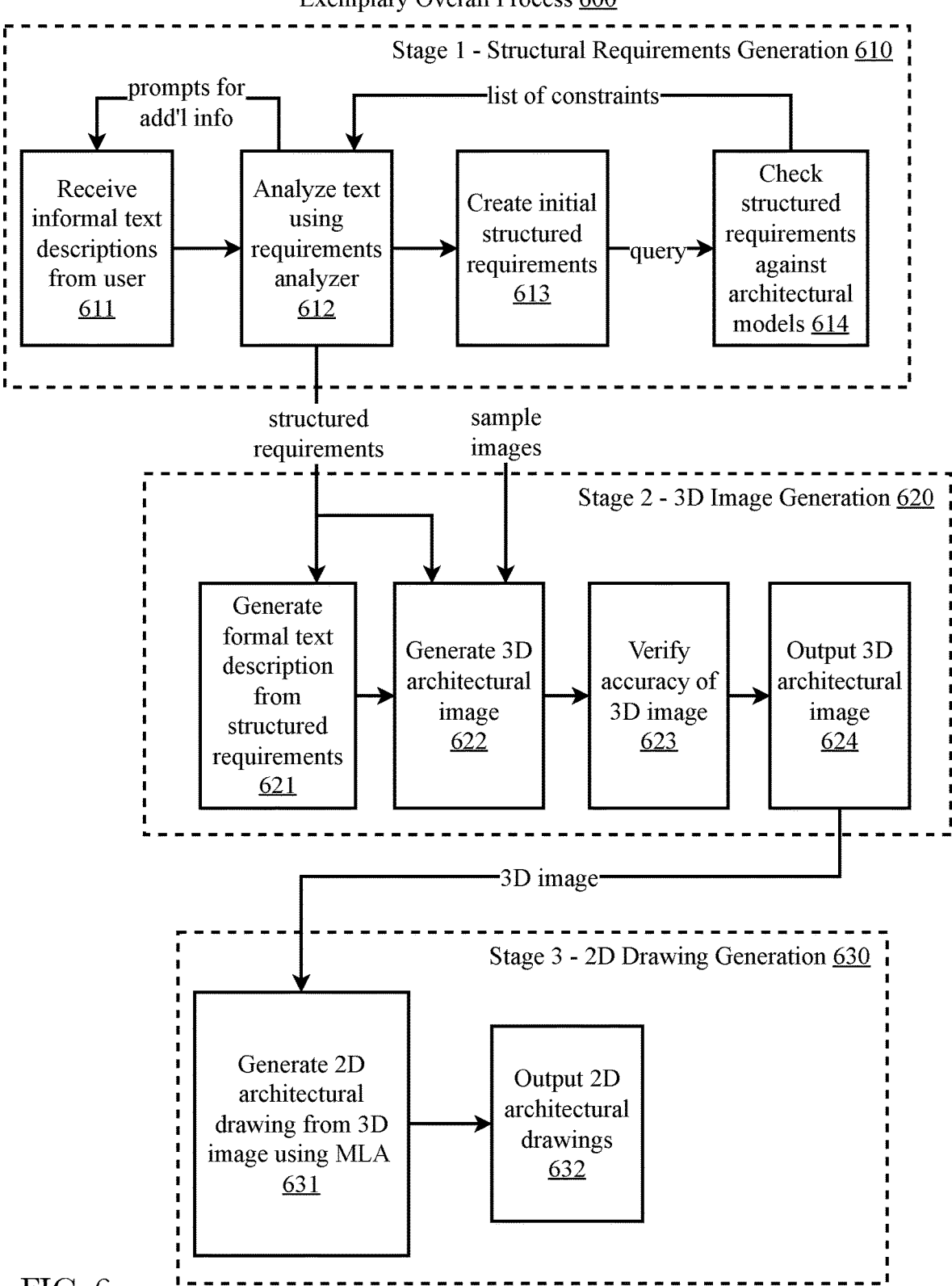
FIG. 6 is a flow diagram illustrating an exemplary process for generating architectural drawings and images from text descriptions.

FIG. 6 is a flow diagram illustrating an exemplary process for generating architectural drawings and images from text descriptions. The exemplary overall process 600 can be divided into roughly three stages, a structural requirements generation stage 610, a 3D image generation stage 620, and a 2D architectural drawings stage 630. In this embodiment, the latter two stages 620, 630 can be performed in parallel as they both depend on receipt of structured requirements for their operation.

If, at the structural requirements generation stage 610, an informal text description of an architectural design concept is received 611, for example: "Design me a kitchen/dining room combination separated by a breakfast counter," the text is analyzed at step 612 and any missing information is gathered either by prompting the user for additional information. When step 612 is complete, a set of initial structured requirements is generated at step 613. The structured requirements are checked by querying one or more architectural models 300 for compatibility with the models 614. When structural requirements generation stage 610 is complete, updated structured requirements are sent to 3D image generation manager 400 for generation of architectural images, and to 2D architectural drawing manager 500 for generation of architectural drawings.

At 3D image generation stage 620, structured requirements are received and converted into a formal text description using an AI-based architectural text generator at step 621. The structured requirements may be received from the process described at step 610, or directly from a structured Q&A manager of inputs and requirements analysis portal 200 as described in FIG. 11. Sample images may also be received from inputs and requirements analysis portal 200. A 3D architectural image is generated from the structured requirements and/or sample images using an AI-based image generation engine at step 622. At step 623, the accuracy, consistency, suitability, and/or usefulness of the image for purposes of the design is verified using one or more verification methods, and appropriate corrections are made based on the verifications. When the verifications are passed, final 3D architectural images are output at step 633 to 2D architectural drawings stage 630.

At 2D architectural drawings stage 630, the 3D image(s) are received and a 3D to 2D architectural drawing machine learning algorithm (MLA) 510 converts the 3D images to 2D architectural drawings. 3D to 2D architectural drawing MLA 510 is trained to convert 3D architectural images to 2D architectural drawings using a database of labeled training data associating 3D architectural images with their floor plans 520. In some embodiments, 3D to 2D architectural drawing MLA 510 may further be trained to utilize the structured requirements in making the conversion. In some embodiments, tools other than an MLA may be used to convert the structured requirements directly to 2D architectural drawings as described in the process shown in FIG. 10.

In summary, this process allows users to generate architectural drawings and images quickly and easily from an informal text description without the need for specialized training or experience.

Figure 7:
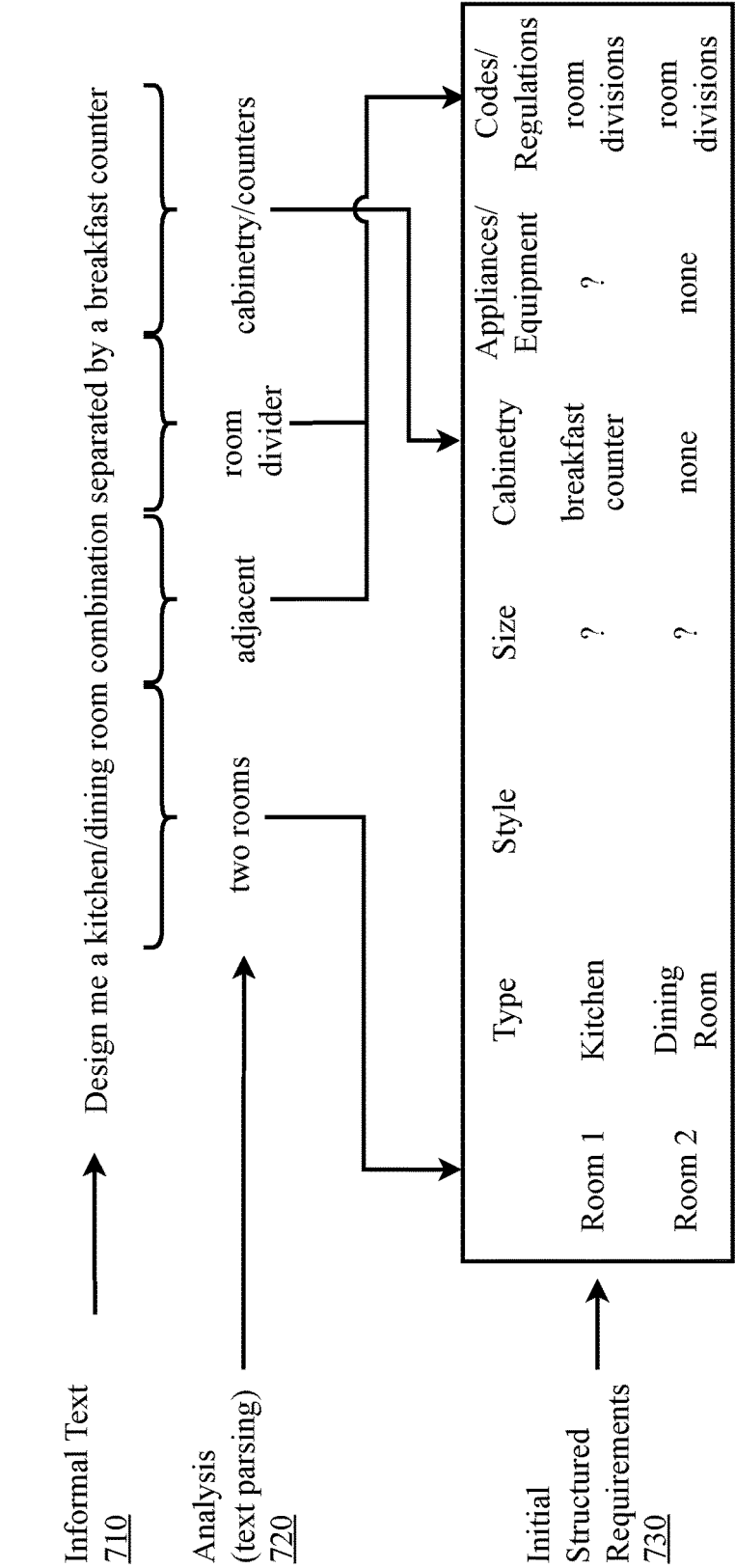
FIG. 7 is a diagram illustrating an exemplary process for conversion of informal text to structural requirements.

FIG. 7 is a diagram illustrating an exemplary process for conversion of informal text to structural requirements. In this exemplary process 700, an informal text description of an architectural design concept is received at step 710, in this case the exemplary text being: "Design me a kitchen/dining room combination separated by a breakfast counter." At step 720, the text is parsed into its constituent words and phrases and analyzed to determine the meaning or intent of each word or phrase, and at step 730 the meaning or intent is stored in a set of initial structured requirements. The parsing and recognition of words and phrases may be performed by a natural language processing (NLP) engine (not shown) trained to recognize the words and phrases and place them in context in order to organize them into structured requirements. For example, the phrase "a kitchen/dining room," when logically analyzed, indicates that two rooms must exist, which is stored in the initial structured requirements data structure as "Room 1" and "Room 2." The phrase "combination," when logically analyzed, indicates that the two rooms are adjacent to one another, and the phrase "separated by" indicates that the adjacent rooms have a room divider, which both cause storage in the initial structured requirements data structure of a "room divisions" flag for checking applicable building code architectural models. The phrase "a breakfast counter" indicates that there is some cabinetry, which is stored in the initial structured requirements data structure as "breakfast counter" (which may be associated with Room 1—Kitchen by querying an architectural model).

Figure 8:
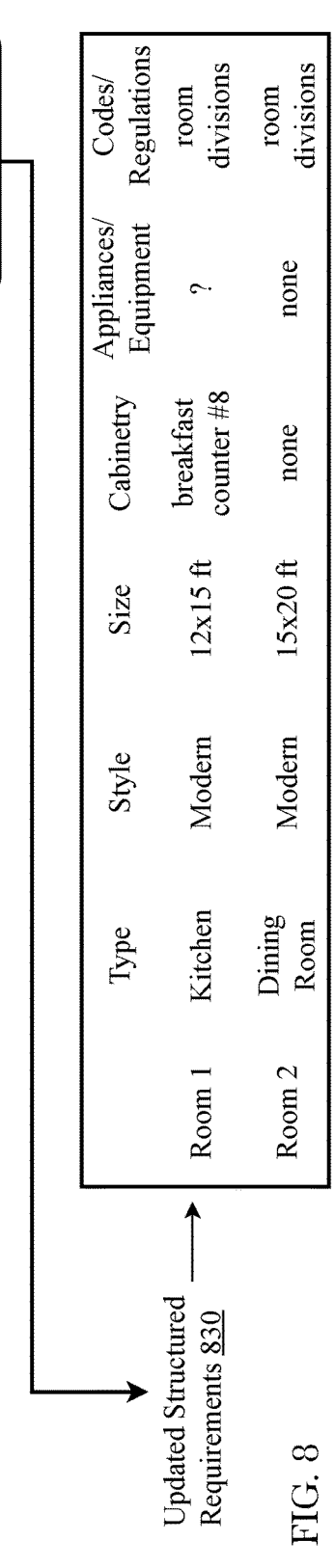
FIG. 8 is a diagram illustrating an exemplary process for querying of architectural modeling engines.

FIG. 8 is a diagram illustrating an exemplary process for querying of architectural modeling engines. In this exemplary process 800, the initial structured requirements data structure of step 730 is received, which contains missing size information as indicated by the question marks. At step 810, prompts for additional information are made to fill in missing information and to obtain additional information by querying architectural models.

A first query 811 asks the user: "Do you know what architectural style you would like?" to which the user responds: "Modern." This information is incorporated into an updated structured requirements data structure at step 830.

A series of queries to architectural models 820 is made to clarify ambiguities or provide additional information. At step 821, the type of breakfast counter is unknown, so a query is made to a cabinetry database to retrieve a breakfast counter in the "Modern" style requested by the user. At step 812, a second query asked the user to select one of several offered breakfast counter designs retrieved from the cabinetry database. At step 822, the user's selection is queried against a building code architectural model to confirm compliance with building codes. At step 813, the user is asked to provide the dimensions of the room, and at step 823, the user's selection of the breakfast counter is checked against a fitting/sizing architectural model to ensure that it fits in the room or in the location selected.

Finally, at step 830, the missing information, clarifications, and resolution of ambiguities are incorporated into an updated structured requirements data structure.

Figure 9:
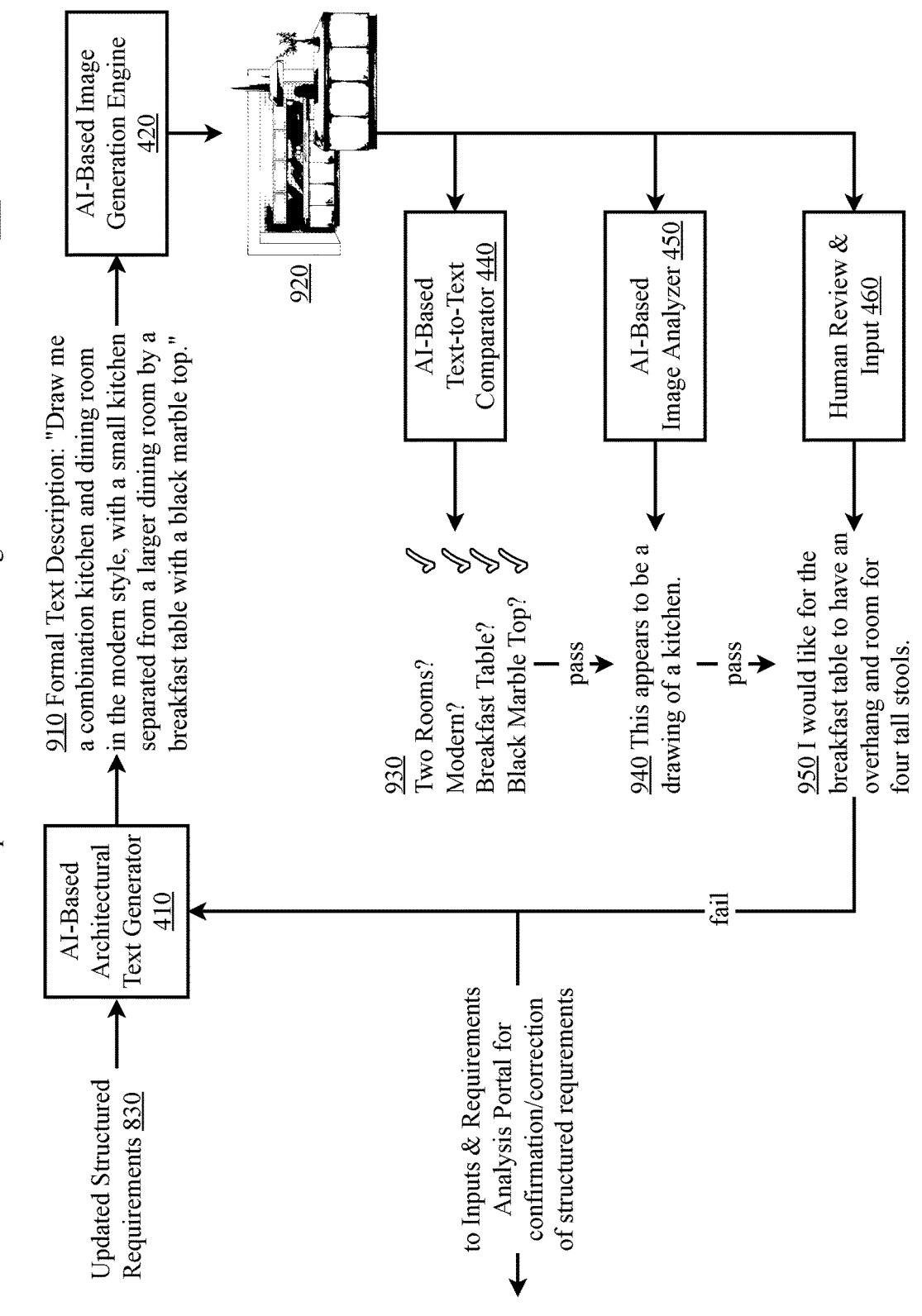
FIG. 9 is a diagram illustrating an exemplary process for generation and verification of 3D architectural images.

FIG. 9 is a diagram illustrating an exemplary process for generation and verification of 3D architectural images. The updated structural requirements of step 830 are received at AI-based architectural text generator 410. AI-based architectural text generator 410 comprises a machine learning algorithm configured to convert structural requirements in some form of a data structure (e.g., tables, database formats like SQL databases, JSON files, etc.) into a formal text description 910 which describes the design in terms of its constituent elements and their relationship to one another. In this example, the formal text description of step 910 is "Draw me a combination kitchen and dining room in the modern style, with a small kitchen separated from a larger dining room by a breakfast table with a black marble top." In this embodiment, AI-based architectural text generator 410 comprises a purpose-built supervised machine learning algorithm which is trained by processing large amounts of labeled architectural training data through machine learning algorithm so that it develops its own, internal, weighted connections for identifying design elements in the structured requirements and associating architectural words and phrases with those elements. In other embodiments, different types of machine learning algorithms may be used, including those trained using training data that is not specialized to the purpose of recognizing architectural terms.

The formal text description of step 910 is then passed to AI-based image generation engine 420 which generates a 3D architectural image 920 from the formal text description. In this embodiment, AI-based image generation engine 420 comprises an open-source or third-party machine learning algorithm trained to produce images from text by an unknown process. A number of such AI-based image generation engines have been developed in recent years such as DALL*E 2, Midjourney, DreamStudio, and others. None of these image generation engines is trained specifically for generating architectural images, so their outputs will be generic and may not be suitable for architectural design purposes. However, an advantage of the system architecture described herein is that an open-source or third-party image generator may be used in this application because its outputs (which will likely not be tailored to architectural applications) will be modified, amended, and updated through a verification process using one or more verification methods. In other embodiments, AI-based architectural text generator 410 will comprise a purpose-built supervised machine learning algorithm which is trained by processing large amounts of labeled training data through machine learning algorithm so that it develops its own, internal, weighted connections for identifying design elements and associating text with those elements.

Each image generated is then subjected to one or more verification methods, a non-limiting list of which includes text-image comparison 930, image analysis 940, and human review and input 950. For the first of these methods, an AI-based image-to-text converter 430 performs the reverse operation of AI-based image generation engine 420, converting the image to a text description. The resulting text description is passed to an AI-based text-to-text comparator 440 to determine the extent to which the text description matches the formal text description used to generate the image. Here, the text to text comparison 930 indicates that all of the expected elements of the design (two rooms, modern style, breakfast table, and black marble top) are met by the design, such that this image passes this verification step 930.

To ensure accuracy of the comparison, AI-based text-to-text comparator 440 of this embodiment comprises a purpose-built supervised machine learning algorithm which is trained by processing large amounts of labeled training data through machine learning algorithm so that it develops its own, internal, weighted connections for identifying design elements and associating text with those elements. A threshold for matching of the text description and formal text description may be established whereby comparison meeting or exceeding the threshold results in a pass of that particular verification. A fail will result in generation of a list of discrepancies between the two text descriptions which will be passed back to AI-based architectural text generator for re-generation of the formal text description to refine it based on discrepancies. In some embodiments, the discrepancies will be passed back further to requirements analyzer 220 to update the structural requirements which will then be re-sent to 3D image generation manager 400.

For the second of these methods, an AI-based image analyzer 450 analyzes the image to determine whether it appears to be an image that reflects the subject of the formal text description. Here, the image analysis indicates that this appears to be a drawing of a kitchen 940, which verifies the subject matter of the image, thus passing this verification step 940.

AI-based image analyzer 450 of this embodiment is an open-source or third-party machine learning algorithm trained to identify the subject of an image. A number of such AI-based subject identification engines have been developed in recent years such as Clarifai, Locobuzz, Amazon™ rekognition, Google™ vision AI, various plant recognition engines, and others. None of these image generation engines is trained specifically for generating architectural images, but many will be able to recognize distinct features such as "this is an image of a kitchen," which is sufficient for confirmation that the generated architectural image is in the right category of things. A threshold for matching of the image analysis output and formal text description may be established whereby comparison meeting or exceeding the threshold results in a pass of that particular verification. A fail will result in generation of a list of discrepancies between the image analysis output and the formal text description which will be passed back to AI-based architectural text generator for re-generation of the formal text description to refine it based on discrepancies. In some embodiments, the discrepancies will be passed back further to requirements analyzer 220 to update the structural requirements which will then be re-sent to 3D image generation manager 400.

For the third of these methods, human review and input 460 will be used to assess the degree to which the generated image meets the user's mental concept of the intended design and suitability of the generated image for the user's purposes. In this method, the user determines whether the generated image passes or fails as a representation of the intended design, and the user may provide text feedback comprising discrepancies between the image and the user's mental concept of the intended design. The user's indication of a fail will cause any discrepancies noted by the user to be passed back to AI-based architectural text generator for re-generation of the formal text description to refine it based on discrepancies. In some embodiments, the discrepancies will be passed back further to requirements analyzer 220 to update the structural requirements which will then be re-sent to 3D image generation manager 400. Here, the user has indicated that he would like for the breakfast table to have an overhang and room for four tall stools. Thus, the image fails the human review and input verification 460 at step 950, and the user's input is sent either back to AI-based architectural text generator 410 for re-generation of the formal text description and/or back to inputs and requirements analysis portal 200 for confirmation and/or correction of the structural requirements.

After the generated image passes all verification steps, a final 3D image is output. Depending on configuration, the final 3D image and the formal text description may be passed on to 2D architectural drawing manager.

Figure 10:
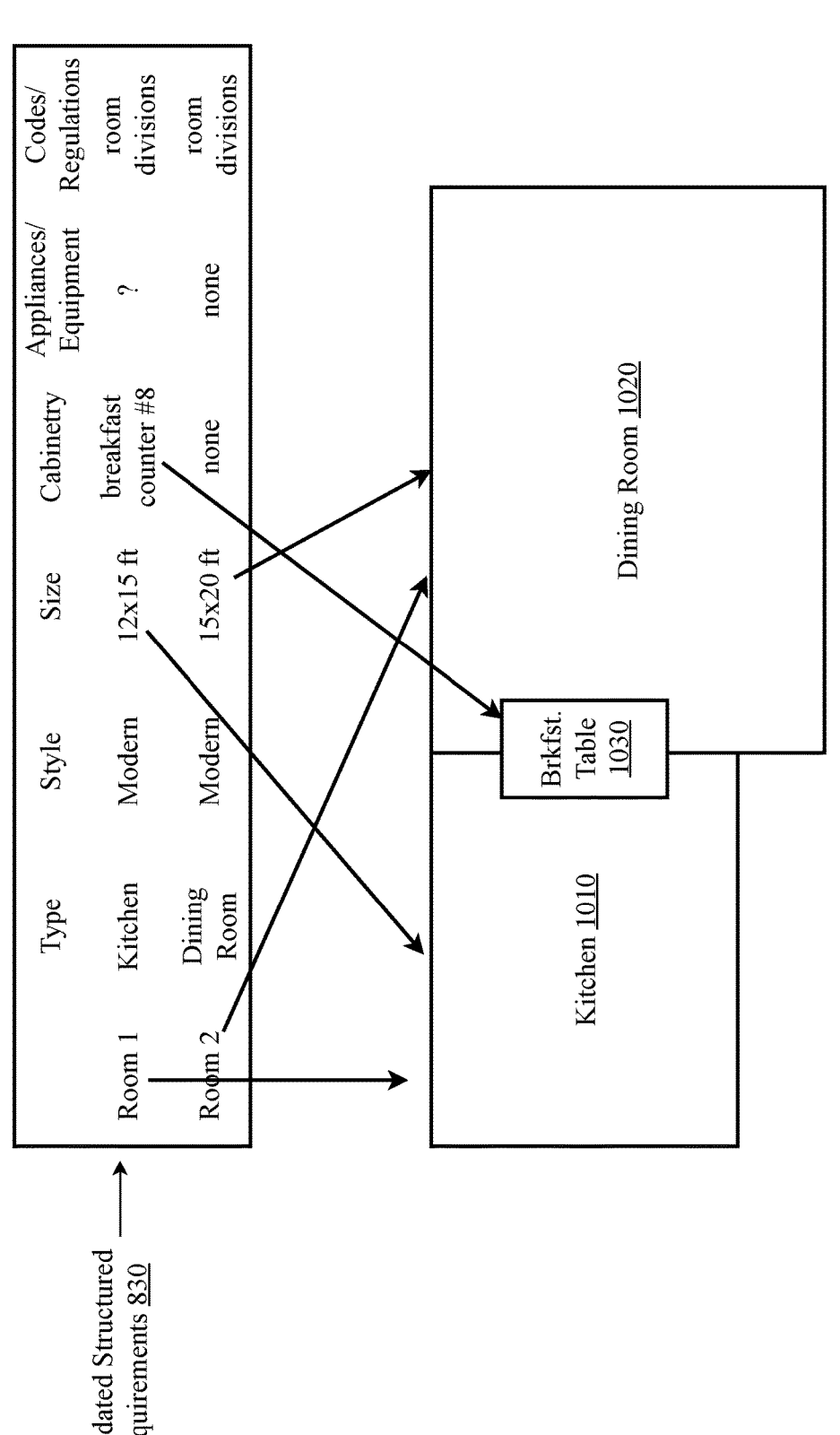
FIG. 10 is a diagram illustrating an exemplary process for generation of 2D architectural images.

FIG. 10 is a diagram illustrating an exemplary process for generation of 2D architectural images. 2D architectural drawing manager 500 receives structured requirements for the intended design, and generates 2D architectural drawings for the intended architectural design. As the structured requirements are in the form of a data structure, they can be readily converted to 2D architectural drawings by mapping of the data fields in the data structure to drawing elements. In this example, Room 1 is shown in the structured requirements as a kitchen of size 12 ft×15 ft, which is converted to a kitchen 1010 of the indicated size in a 2D architectural drawing. Room 2 is shown in the structured requirements as a dining room of size 15 ft×20 ft, which is converted to a dining room 1020 in the 2D architectural drawing. Breakfast counter #8 is shown in the structured requirements as a room divider and is converted to a breakfast table 1030 of the indicated size in the 2D architectural drawing.

Where conflicts or ambiguities exist, they can be clarified by querying architectural modeling engines 300 or by prompting the user for additional information. A floor plan rendering tool 520 may be used to display the resulting 2D architectural drawings. The 2D architectural drawings may be used for visualization, measurement, construction bids, permit applications, and/or other purposes for which such drawings are typically used.

FIG. 11 is an exemplary screenshot for a structured question and answer manager. One way to obtain structured requirements for a design project is to query the user using a structured question and answer (Q&A) design template. A structured Q&A design template allows for inputs from a user in a structured format which reduces error and uncertainty and can be directly placed into any needed structured requirements format.

Here, an exemplary screenshot 1100 for a structured question and answer manager is shown. The screenshot 1100 is divided into several sections, one for the type of room being designed 1110, one for the size of the room 1120, one for a first counter 1130, and one for a second counter 1140.

The type of room section 1110 has a drop down menu which allows a user to select the type of room being designed. Here, a dropdown menu is shown with options for kitchen, bedroom, closet, and ellipses showing that addition options are available. The type of room "kitchen" is shown as being selected in the dropdown menu.

The room size section 1120 shows discrete data entry boxes for the room dimensions, length, width, and height. Using discrete data entry boxes minimizes error and uncertainty.

Because the room type is "kitchen," options for counters are displayed to the user. In the counter 1 section 1130, discrete data entry boxes for the counter dimensions, length, width, and height. Using discrete data entry boxes minimizes error and uncertainty. A dropdown menu is shown for the location of the counter with options for north wall, east wall, south wall, and ellipses showing that addition options are available. The location "north wall" is shown as being selected in the dropdown menu. A dropdown menu is shown for the alignment of the counter with options for center, left corner, right corner, and ellipses showing that addition options are available. The location "center" is shown as being selected in the dropdown menu. In the counter 2 section 1140, discrete data entry boxes for the counter dimensions, length, width, and height. Using discrete data entry boxes minimizes error and uncertainty. A dropdown menu is shown for the location of the counter with options for north wall, east wall, south wall, and ellipses showing that addition options are available. The location "east wall" is shown as being selected in the dropdown menu. A dropdown menu is shown for the alignment of the counter with options for center, left corner, right corner, and ellipses showing that addition options are available. The location "left corner" is shown as being selected in the dropdown menu.

The structured Q&A format of this example can be expanded to any type of room, size of room, shape of room, and cabinets and furnishings for each room.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, or on an application-specific integrated circuit (ASIC), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 12:
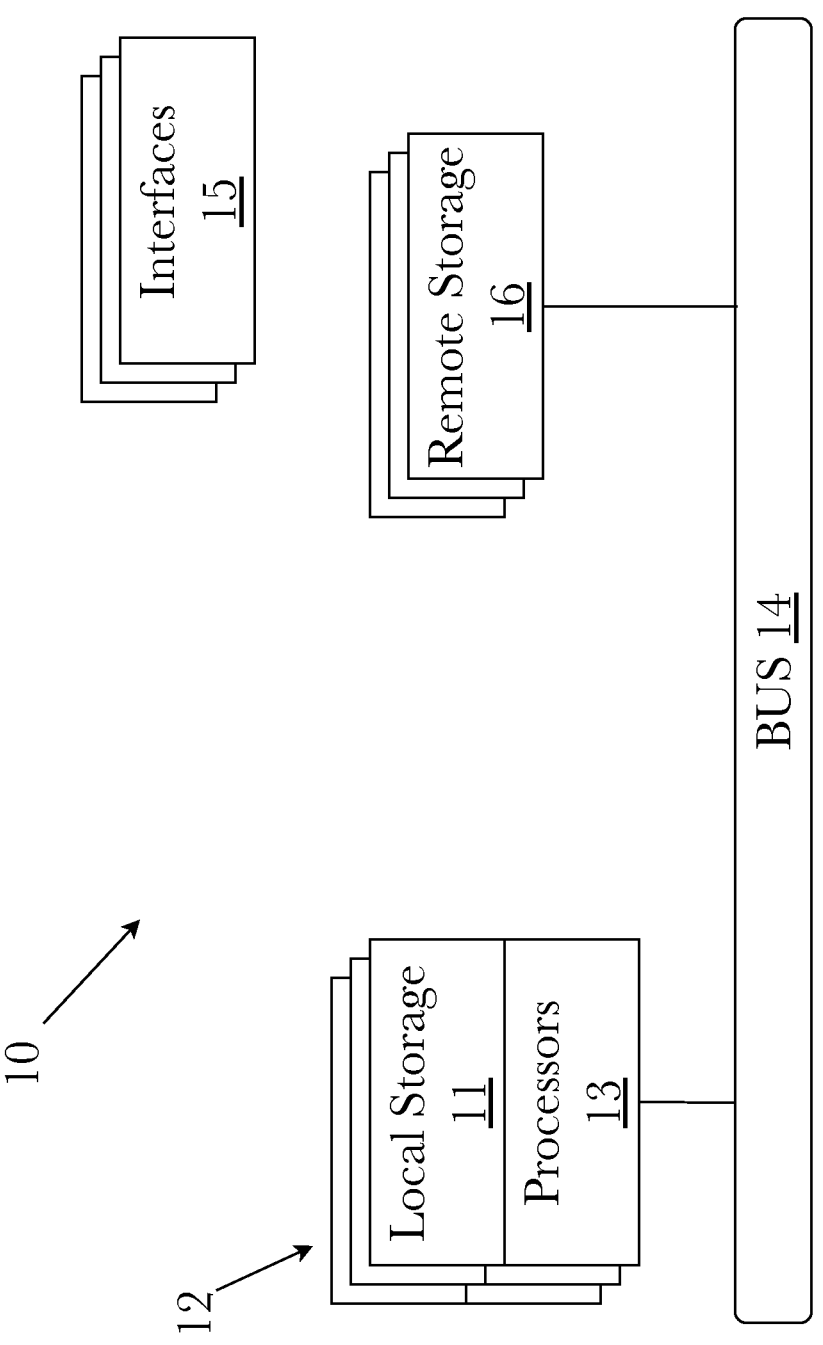
FIG. 12 is a block diagram illustrating an exemplary hardware architecture of a computing device.

Referring now to FIG. 12, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some aspects, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAP-DRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™ THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FD-DIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 12 illustrates one specific architecture for a computing device 10 for implementing one or more of the aspects described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, a single processor 13 handles communications as well as routing computations, while in other aspects a separate dedicated communications processor may be provided. In various aspects, different types of features or functionalities may be implemented in a system according to the aspect that includes a client device (such as a tablet device or smart-phone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the aspects described herein (or any combinations of the above). Pro-gram instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device aspects may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly com-mon in the art with regard to personal computers), memristor memory, random access memory (RAM), and the like. It should be appreciated that such storage means may be integral and non-removable (such as RAM hardware mod-ules that may be soldered onto a motherboard or otherwise integrated into an electronic device), or they may be remov-able such as swappable flash memory modules (such as "thumb drives" or other removable media designed for rapidly exchanging physical storage devices), "hot-swap-pable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files contain-ing higher level code that may be executed by the computer using an interpreter (for example, scripts written in Python, Perl, Ruby, Groovy, or any other scripting language).

Figure 13:
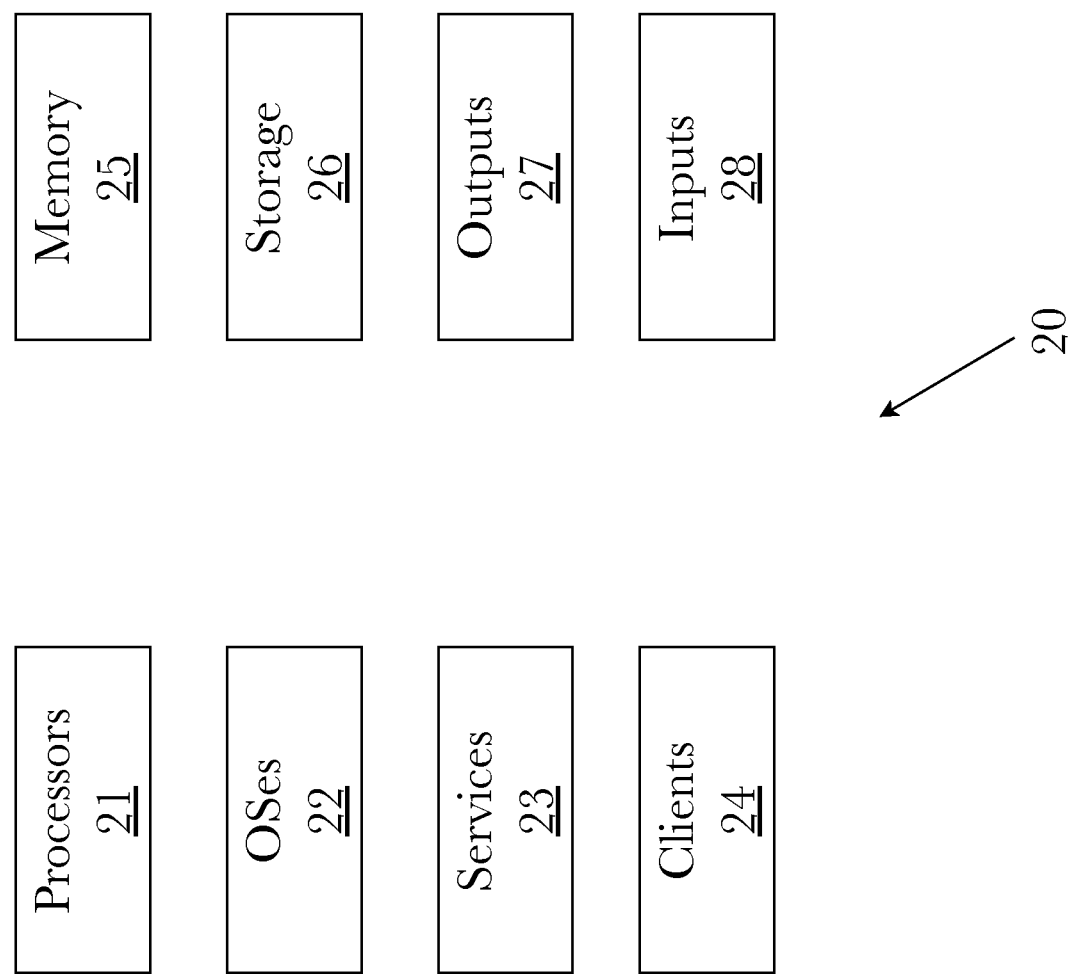
FIG. 13 is a block diagram illustrating an exemplary logical architecture for a client device.

In some aspects, systems may be implemented on a standalone computing system. Referring now to FIG. 13, there is shown a block diagram depicting a typical exem-plary architecture of one or more aspects or components thereof on a standalone computing system. Computing device 20 includes processors 21 that may run software that carry out one or more functions or applications of aspects, such as for example a client application 24. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touch-pad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 12). Examples of storage devices 26 include flash memory, magnetic hard drive, CD-ROM, and/or the like.

Figure 14:
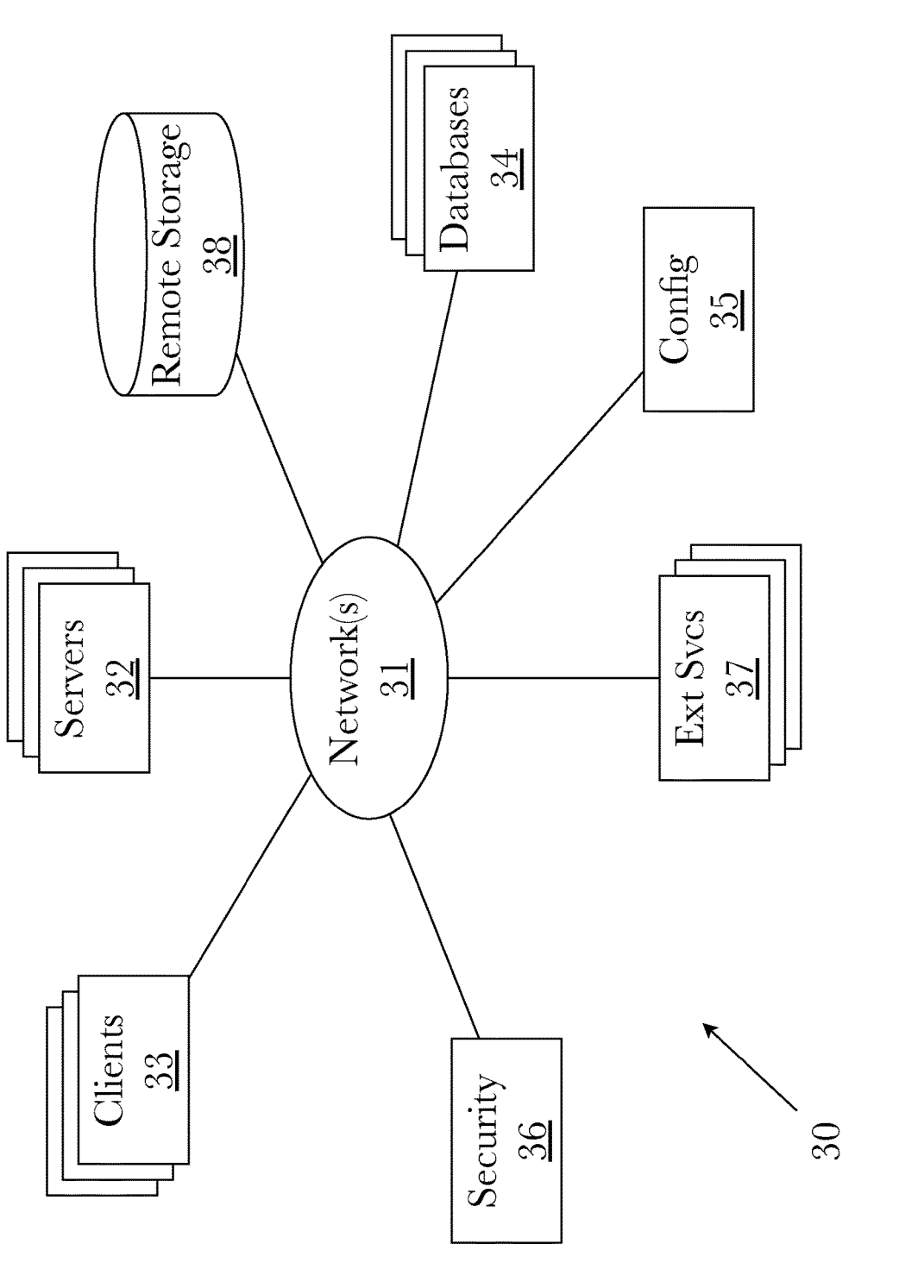
FIG. 14 is a block diagram showing an exemplary architectural arrangement of clients, servers, and external services.

In some aspects, systems may be implemented on a distributed computing network, such as one having any number of clients and/or servers. Referring now to FIG. 14, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 13. In addition, any number of servers 32 may be provided for handling requests received from one or more clients 33. Clients 33 and servers 32 may communicate with one another via one or more electronic networks 31, which may be in various aspects any of the Internet, a wide area network, a mobile telephony network (such as CDMA or GSM cellular networks), a wireless network (such as WiFi, WiMAX, LTE, and so forth), or a local area network (or indeed any network topology known in the art; the aspect does not prefer any one network topology over any other). Networks 31 may be implemented using any known network protocols, including for example wired and/or wireless pro-tocols.

In addition, in some aspects, servers 32 may call external services 37 when needed to obtain additional information, or to refer to additional data concerning a particular call. Communications with external services 37 may take place, for example, via one or more networks 31. In various aspects, external services 37 may comprise web-enabled services or functionality related to or installed on the hard-ware device itself. For example, in one aspect where client applications 24 are implemented on a smartphone or other electronic device, client applications 24 may obtain infor-mation stored in a server system 32 in the cloud or on an external service 37 deployed on one or more of a particular enterprise's or user's premises. In addition to local storage on servers 32, remote storage 38 may be accessible through the network(s) 31.

In some aspects, clients 33 or servers 32 (or both) may make use of one or more specialized services or appliances that may be deployed locally or remotely across one or more networks 31. For example, one or more databases 34 in either local or remote storage 38 may be used or referred to by one or more aspects. It should be understood by one having ordinary skill in the art that databases in storage 34 may be arranged in a wide variety of architectures and using a wide variety of data access and manipulation means. For example, in various aspects one or more databases in storage 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some aspects, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some aspects may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with aspects without limitation, unless a specific security 36 or configuration system 35 or approach is specifically required by the description of any specific aspect.

Figure 15:
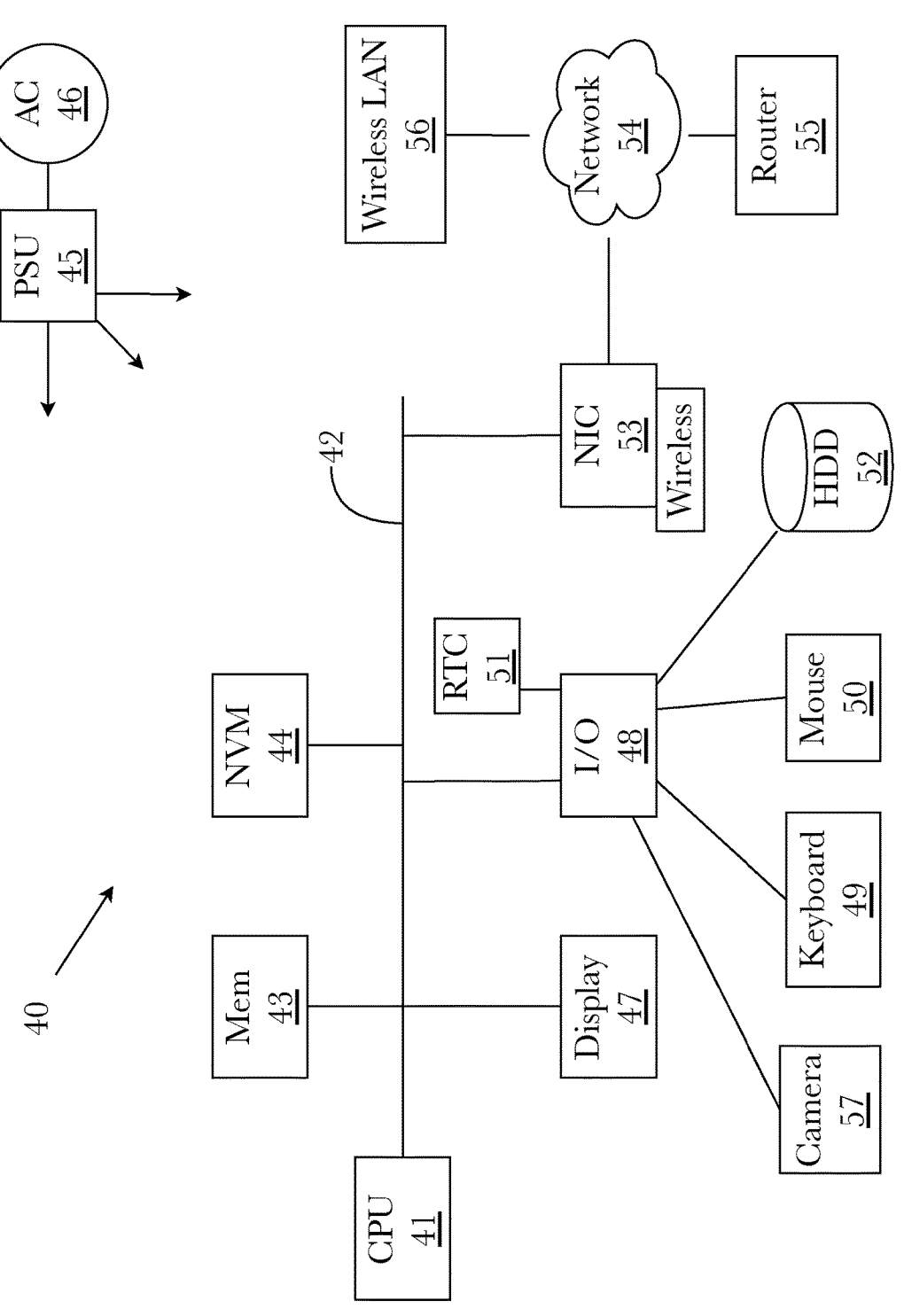
FIG. 15 is another block diagram illustrating an exemplary hardware architecture of a computing device.

FIG. 15 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to peripherals such as a keyboard 49, pointing device 50, hard disk 52, real-time clock 51, a camera 57, and other peripheral devices. NIC 53 connects to network 54, which may be the Internet or a local network, which local network may or may not have connections to the Internet. The system may be connected to other computing devices through the network via a router 55, wireless local area network 56, or any other network connection. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various aspects, functionality for implementing systems or methods of various aspects may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various aspects described above. Accordingly, the present invention is defined by the claims and their equivalents.

What is claimed is:

1. A specialized architectural drawing system for transforming informal descriptions into permit-ready construction documents, comprising:

a computing device comprising a memory and a processor;

an inputs and requirements analysis portal comprising a first plurality of programming instructions stored in the memory which, when operating on the processor, causes the computing device to:

receive some combination of informal text descriptions of architectural spaces, building elements, and construction requirements, structured requirements, and sample images for an architectural design;

where informal text descriptions are received, convert the informal text descriptions into structured requirements by:

parsing the informal text description into its constituent words and phrases;

analyzing the words and phrases using a natural language processing engine to determine their context in relation to architectural elements; and creating a set of structured requirements from the context of the words and phrases, the structured requirements comprising a data structure and data representing architectural specifications including room dimensions, spatial relationships, material selections, and fixture placements;

querying one or more architectural modeling engines for compatibility with the models and receiving constraints or conflicts from the modeling engines; and send the structured requirements and any sample images to a three-dimensional (3D) image generation manager;

the three-dimensional (3D) image generation manager comprising a second plurality of programming instructions stored in the memory which, when operating on the processor, causes the computing device to:

receive the structured requirements and sample images;

generate a 3D architectural image by processing the structured requirements and sample images through a 3D image generation machine learning algorithm which has been trained on architectural data including building codes, standard measurements, and architectural styles to generate 3D architectural images from a database of labeled training data associating structured requirements with their 3D architectural image counterparts and associating colors and textures from sample images with components of 3D architectural images;

verify the 3D architectural image by converting the 3D architectural image to converted text using an AI-based image-to-text converter and comparing the converted text to a formal text description using an AI-based text-to-text comparator; and output the 3D architectural image;

the two-dimensional (2D) architectural drawing manager comprising a third plurality of programming instructions stored in the memory which, when operating on the processor, causes the computing device to:

receive the 3D architectural image;

generate a 2D architectural drawing from the 3D architectural image suitable for permit application and construction by processing the 3D image through a second machine learning algorithm which has been trained to generate 2D architectural drawings from a database of labeled training data associating 3D architectural images with their 2D architectural drawing counterparts; and output the 2D architectural drawing.

2. The system of claim 1, further comprising an architectural modeling engine comprising a fourth plurality of programming instructions stored in the memory which, when operating on the processor, causes the computing device to:

receive a query from the inputs and requirements analysis portal, the query comprising a portion of the data from the structured requirements;

determine whether the portion of the data is consistent with a parameter of an architectural model of the architectural modeling engine; and provide a response to the inputs and requirements analysis portal, wherein:

if the determination is that the data is consistent with the parameter, the response so indicates; and if the determination is that the data is not consistent with the parameter, the response comprises an architectural constraint.

3. The system of claim 1, wherein the three-dimensional (3D) image generation manager is programmed to perform a second verification of the 3D architectural image wherein:

the 3D architectural image is converted to converted text using an AI-based image-to-text converter; and the converted text is compared to the formal text description using an AI-based text-to-text comparator, wherein:

if the comparison falls below a threshold level of likeness, the formal text description is re-generated to increase the level of likeness above the threshold; and if the comparison meets or exceeds the threshold level of likeness, output the 3D architectural image.

4. The system of claim 1, wherein the three-dimensional (3D) image generation manager is programmed to perform a third verification of the 3D architectural image wherein:

the 3D architectural image is analyzed using an AI-based image-to-text converter to determine a subject of the image; and the subject is compared to the formal text description, wherein:

if the comparison falls below a threshold level of likeness, the formal text description is re-generated to increase the level of likeness above the threshold; and if the comparison meets or exceeds the threshold level of likeness, output the 3D architectural image.

5. A method for transforming informal descriptions into permit-ready construction documents, comprising the steps of:

using an inputs and requirements analysis portal operating on a computing device comprising a memory and a processor to:

receive some combination of informal text descriptions of architectural spaces, building elements, and construction requirements, structured requirements, and sample images for an architectural design;

where informal text descriptions are received, convert the informal text descriptions into requirements by:

parsing the informal text description into its constituent words and phrases;

analyze the words and phrases using a natural language processing engine to determine their context in relation to architectural elements; and create a set of structured requirements from the context of the words and phrases, the structured requirements comprising a data structure and data representing architectural specifications including room dimensions, spatial relationships, material selections, and fixture placements;

querying one or more architectural modeling engines for compatibility with the models and receiving constraints or conflicts from the modeling engines; and send the structured requirements and any sample images to a three-dimensional (3D) image generation manager;

using the three-dimensional (3D) image generation manager operating on the computing device to:

receive the structured requirements and sample images;

generate a 3D architectural image representing spatial and structural elements of buildings by processing the structured requirements and sample images by processing the structured requirements and sample images through a 3D image generation machine learning algorithm which has been specifically trained on architectural data including building codes, standard measurements, and architectural styles to generate 3D architectural images from a database of labeled training data associating structured requirements with their 3D architectural image counterparts and associating colors and textures from sample images with components of 3D architectural images;

verify the 3D architectural image by converting the 3D architectural image to converted text using an AI-based image-to-text converter and comparing the converted text to a formal text description using an AI-based text-to-text comparator; and output the 3D architectural image;

using the two-dimensional (2D) architectural drawing manager operating on the computing device to:

receive the 3D architectural image;

generate a 2D architectural drawing from the 3D architectural image suitable for permit application and construction by processing the 3D image through a second machine learning algorithm which has been trained to generate 2D architectural drawings from a database of labeled training data associating 3D architectural images with their 2D architectural drawing counterparts; and output the 2D architectural drawing.

6. The method of claim 5, further comprising the steps of using an architectural modeling engine operating on the computing device to perform the steps of:

receiving a query from the inputs and requirements analysis portal, the query comprising a portion of the data from the structured requirements;

determining whether the portion of the data is consistent with a parameter of an architectural model of the architectural modeling engine; and providing a response to the inputs and requirements analysis portal, wherein:

if the determination is that the data is consistent with the parameter, the response so indicates; and if the determination is that the data is not consistent with the parameter, the response comprises an architectural constraint.

7. The method of claim 5, further comprising the steps of using the three-dimensional (3D) image generation manager to perform a second verification of the 3D architectural image wherein:

the 3D architectural image is converted to converted text using an AI-based image-to-text converter; and the converted text is compared to the formal text description using an AI-based text-to-text comparator, wherein:

if the comparison falls below a threshold level of likeness, the formal text description is re-generated to increase the level of likeness above the threshold; and if the comparison meets or exceeds the threshold level of likeness, output the 3D architectural image.

8. The method of claim 5, further comprising the steps of using the three-dimensional (3D) image generation manager to perform a third verification of the 3D architectural image wherein:

the 3D architectural image is analyzed using an AI-based image-to-text converter to determine a subject of the image; and the subject is compared to the formal text description, wherein:

if the comparison falls below a threshold level of likeness, the formal text description is re-generated to increase the level of likeness above the threshold; and if the comparison meets or exceeds the threshold level of likeness, output the 3D architectural image.

\* \* \* \* \*